United States Patent [19]

Guterman et al.

[11] Patent Number: 4,980,859
[45] Date of Patent: Dec. 25, 1990

[54] NOVRAM CELL USING TWO DIFFERENTIAL DECOUPLABLE NONVOLATILE MEMORY ELEMENTS

[75] Inventors: Daniel C. Guterman, Fremont; Isao Nojima, Sunnyvale; Ping Wang, Saratoga, all of Calif.

[73] Assignee: XICOR, Inc., Milpitas, Calif.

[21] Appl. No.: 335,112

[22] Filed: Apr. 7, 1989

[51] Int. Cl.[5] .................................................. G11C 7/00
[52] U.S. Cl. .................................... 365/154; 365/185; 365/228
[58] Field of Search ............... 365/154, 185, 203, 228, 365/190

[56] References Cited

U.S. PATENT DOCUMENTS

| | | | |
|---|---|---|---|
| 3,911,464 | 10/1975 | Chang et al. | 357/23.5 |
| 4,271,487 | 6/1981 | Craycraft et al. | 365/154 |
| 4,510,584 | 4/1985 | Dias et al. | 365/185 |
| 4,686,652 | 8/1987 | Spence | 365/185 X |
| 4,799,194 | 1/1989 | Arakawa | 365/154 |

*Primary Examiner*—Joseph A. Popek
*Attorney, Agent, or Firm*—McCubbrey, Bartels, Meyer & Ward

[57] ABSTRACT

A nonvolatile, semiconductor randon access memory cell comprising a static RAM element and a nonvolatile memory element having differential charge storage capabilities is presented. The static RAM and nonvolatile memory elements are interconnected to allow information to be exchanged between two elements, thus allowing the faster static RAM element to serve as the primary memory to the system and allowing the nonvolatile memory element to serve as permanent storage during power-down conditions. In one embodiment, the nonvolatile memory element comprises two electrically erasable PROM devices (EEPROMs). The two EEPROM devices store differential charges corresponding to the complementary outputs of the static RAM element. The nature of the differential charge storage allows lower programming voltages to be used on the EEPROM devices, resulting in increased storage intergrity and increased endurance of the EEPROM devices.

27 Claims, 2 Drawing Sheets

NOVRAM CELL USING TWO DIFFERENTIAL DECOUPLABLE NONVOLATILE MEMORY ELEMENTS

This application is related to U.S. Pat. No. 4,300,212, NONVOLATILE STATIC RANDOM ACCESS MEMORY DEVICES, issued Nov. 10, 1981 and to U.S. Pat. No. 4,263,664, NONVOLATILE STATIC RANDOM ACCESS MEMORY SYSTEM, issued Apr. 21, 1981.

This invention relates generally to the field of metal oxide semiconductor random access memory systems (MOS RAMs), and more specifically to the use in such systems of nonvolatile memory cells, such as Electrically Erasable, Programmable Read Only Memory systems (EEPROM or E$^2$PROMs) which incorporate floating gate nonvolatile charge storage elements. In particular, the present invention provides a nonvolatile random access memory (NOVRAM) system wherein two direct write nonvolatile floating gate EEPROM cells are included in each NOVRAM cell. One of these EEPROM cells is directly connected to each of the internal nodes of an associated standard latch, such as a conventional MOS volatile RAM cell. It will be appreciated that a plurality of MOS latches and their associated nonvolatile E$^2$PROM cells can be arranged in an array to provide a very compact NOVRAM enabling the storage and recall of binary data bits from nonvolatile memory cells to associated MCS RAM cells.

In the prior art, many static RAMs employ bistable semiconductor circuits, such as flip-flop circuits, as a memory cell for latching a bit of binary data. Two binary, distinguishable memory states for information storage are provided by this latch, dependent upon the conductive configuration of two separate branches. The output of such a memory cell is one of two voltages, typically either zero volts or near the supply voltage. Such semiconductor memory cells are considered to be "volatile". That is, if electrical power is removed from the cell, the output voltage which distinguishes the latched memory state will cease to exist and the information in the cell is thereby lost. Volatility is a substantial disadvantage of conventional semiconductor memory systems, and substantial effort in the art has been made to develop circuit elements and structures for providing nonvolatility to semiconductor memory circuits when power is removed.

Nonvolatile devices based on the use of charge storage structures are conventionally used for systems needing prolonged data retention without power. A typical charge storage element is called a floating gate. A floating gate is an island of conductive material that is electrically isolated from a substrate but capacitively coupled to the substrate, and which forms the gate of an MOS transistor. Depending on the level of charge stored on the floating gate, the associated MOS transistor will be rendered conductive ("on") or nonconductive ("off"). This also forms the basis for memory device storage of binary "one" or "zero" data corresponding to the presence or absence of a trapped charge on the floating gate. Various means for introducing and removing the charge to and from the floating gate are known. Once the floating gate is at a particular charge level, it remains there permanently, because the floating gate is completely surrounded by an insulating material which acts as a barrier to the discharging of the floating gate.

Charge is typically introduced onto the floating gate using hot electron injection or electron tunneling. Charge is typically removed from the floating gate by exposure to radiation (UV light, x-rays), avalanche injection, or electron tunneling. The term tunneling is used herein in a broad sense to include the emission of an electron from the surface of a conductor (including semiconductors) into an adjacent insulator or dielectric.

Other nonvolatile RAM devices do not use floating gates, but rather other structures, such as a metal nitride-oxide semiconductor structure (MNOS) in which charge is trapped at a silicon nitride, silicon dioxide interface.

Accordingly, it is desirable to couple a nonvolatile element to a RAM circuit to provide nonvolatility in a semiconductor memory array. Known coupling circuits or techniques suffer from various disadvantages. For example, interfacing may be carried out by introducing a conductance imbalance caused by the nonvolatile element being directly connected between the two branches of a cross-coupled static RAM cell. Such a conductance imbalance requires that the cross-coupled static RAM cell carry a DC offset current which must be overcome when the cell is in normal RAM mode operation. Such imbalances can lead to read and write disturb marginalities in an array of such cells in a memory circuit. Moreover, such marginalities present manufacturing yield limitations and testing problems.

Another important consideration regarding the interfacing of nonvolatile elements with static RAM cells concerns the need for compactness and simplicity in device design, as these factors most often determine circuit size and cost. Many prior art interface systems unfortunately tend to require complex interfacing circuitry in terms of control signals and extra transistors. This has resulted in unacceptably large nonvolatile static RAM circuit size and correspondingly high cost.

In the prior art, nonvolatile static RAM devices also tend to utilize the semiconductor substrate as the principal element in programming the nonvolatile memory components. This may involve the undesirable application of high voltages and currents to the RAM power line to effect nonvolatile data storage. Accordingly, it is difficult to independently optimize and separate the RAM system design and fabrication process from the nonvolatile memory system design and fabrication process. The requirements for an external high voltage power supply and high current also adversely affect the cost, ease of use and general applicability of such conventional nonvolatile RAM memory systems. For example, in prior art devices there may be a need to shift to a high voltage level at the RAM latch. The high level shifting requires additional components which take up valuable space in an integrated circuit.

Prior art nonvolatile static RAM memories are known which incorporate a floating gate nonvolatile memory element for storing a binary data bit as the presence or absence of retained charge on the floating gate. The known floating gate devices use the high field tunneling effect first described by Fowler Nordheim in 1928. In such a nonvolatile cell, a dielectric, such as silicon dioxide, completely surrounds the "floating" gate and thereby electrically isolates the floating gate from surrounding elements.

As an example of the prior art, Troutman, et al., U.S. Pat. No. 4,128,773, issued Dec. 5, 1978 discloses a nonvolatile element using a separate specially constructed variable threshold transistor coupled to each leg or node of an associated RAM cell, whose threshold voltage can be raised or lowered upon application of a relatively high voltage pulse between the gate and substrate. The high voltage pulse is therefore also by necessity coupled directly to the RAM. This method has the disadvantage that the RAM must be specially constructed to withstand the application of high voltages. This method has the further disadvantage of high power consumption. Moreover, the high voltage operating requirements may reduce the useful device lifetime of the nonvolatile element by accelerating the trap up of hot electrons.

Another prior art NOVRAM memory cell is described in Simko, U.S. Pat. No. 4,300,212, issued Nov. 10, 1981. In this reference, a single nonvolatile cell is capacitively coupled to the internal data and inverse data nodes of a volatile, MOS RAM flip flop memory. The RAM may be a standard six transistor RAM cell of conventional operation, and the nonvolatile memory cell may be nonvolatile electrically erasable programmable ROM (EEPROM). Nonvolatile storage of the current data bit state of the volatile memory cell to the nonvolatile memory cell is accomplished by controlling the amount of charge on a floating gate conductor composed of polysilicon, for example. The floating gate of the nonvolatile EEPROM is an island or intermediate conductive layer surrounded by an oxide layer. In a conventional layout, a first layer of polysilicon is disposed beneath the floating gate and surrounding oxide. A third polysilicon layer is disposed above the floating gate and surrounding oxide. Electrons are moved to or from the floating gate by applying electric fields of sufficient strength to cause electron tunneling through the surrounding oxide. Electrons are injected onto the floating gate by tunneling from the first polysilicon layer and electrons are removed from the floating gate by tunneling from the floating gate to the third polysilicon layer. Except for these tunneling elements and their associated capacitive couplings to the floating gate, the floating gate is isolated from the rest of the circuit.

In the type of nonvolatile RAM disclosed in the Simko reference, additional capacitors must be formed for coupling the EEPROM to the RAM. The exclusively capacitively coupled RAM-EEPROM has drawbacks in that on-chip capacitors require significantly more die area than other structures. Accordingly, capacitively coupled EEPROMs are necessarily larger in size and cannot be scaled down or miniaturized without severely disrupting the necessary capacitive relationships. It is therefore desirable to eliminate one or more capacitive couplings in the nonvolatile RAM device.

Also it has been found that a lower tunneling voltage enhances device lifetime by reducing the trap up rate of tunneling electrons. Furthermore, in order to scale down the size of a nonvolatile memory, lower programming voltages are needed so that the isolation widths and device channel lengths can be reduced in the memory array and in peripheral circuitry. This is not practical in such a single nonvolatile cell NOVRAM since it must use a single-ended dynamic recall. This requires that the floating gate voltage for erase and program must differ by several volts in order to reliably perform a recall operation.

It is an object of the present invention to minimize the voltage requirements of a nonvolatile memory to thereby increase the endurance of a NOVRAM.

It is a further object of this invention to lower the charge level needed to establish a detectable state. This is provided through the use of differential recall. Differential recall is defined as correctly sensing a small difference in the charge level between two floating gates using the RAM volatile memory cell as a sense amplifier. This is different from prior art single-ended $E^2$-PROM cell implementations which require the $E^2$-PROM cell to be turned on and turned off hard by floating gate voltages several volts apart to enable the volatile memory cell to correctly sense the charge level stored in the $E^2$PROM.

It is another object of the present invention to provide a NOVRAM cell containing a simplified interface between a MOS RAM memory element and the nonvolatile portion of the cell. According to the present invention, the nonvolatile memory includes two nonvolatile memory cells, each one of which is selectively connected to a respective corresponding internal node of the MOS RAM. The interface between a given internal node and a corresponding nonvolatile cell comprises a standard MOS field effect transistor which is capable of isolating the RAM from the nonvolatile memory cell.

It is another object of the present invention to achieve long retention of nonvolatile data by fully isolating the nonvolatile memory cell from RAM operating voltages during normal volatile RAM operations, e.g., read, write, and standby.

It is another object of the present invention to make the NOVRAM smaller in size and more scaleable.

It is a further object of the present invention to operate a volatile random access memory with low voltages that are independent of the voltages needed to generate tunneling in the associated nonvolatile memory.

SUMMARY OF THE INVENTION

In accordance with these and other objects of the present invention, the present invention provides a nonvolatile random access memory device (NOVRAM) comprising a volatile semiconductor memory cell, in the preferred embodiment, a conventional six transistor MOS RAM latch for latching the state of a bit of binary data so long as power is supplied to the volatile memory cell. The volatile memory cell includes first and second complementary internal nodes wherein said bit of binary data appears as one of two voltage levels on each said internal node whose value depends on whether a binary "1" or "0" is latched in said volatile memory cell. A nonvolatile memory means interfaces directly with the volatile latch cell without the need for buffering or high voltage level shifting. The nonvolatile memory means comprises first and second nonvolatile memory cells each of which is coupled to a corresponding one of the first and second internal nodes of the RAM latch and preferably selectively connected thereto by a gating means. This gating means is responsive to a control signal generated by a bit store means during a data bit store operation to the nonvolatile memory.

Each nonvolatile memory cell further comprises an electrically isolated charge storage element, such as a floating gate, for storing a binary data bit state as a charge potential. Fowler-Nordheim tunneling is the preferred mechanism used to transport charge to, and remove charge from the floating gate.

Data bit store and recall means are also provided for effecting, respectively, storage of the latched data bit in said nonvolatile memory cells and recall of a stored data bit from said nonvolatile memory cells to said volatile latch.

Broadly stated, the present invention comprises a nonvolatile memory device for nonvolatile storage of binary data comprising a volatile semiconductor memory cell for latching a bit of binary data, said cell including first and second internal nodes wherein said bit of binary data appears as one of two voltage levels on each said internal node whose value depends on whether a binary "1" or "0" is latched in said cell; a nonvolatile memory means comprising first and second nonvolatile memory cells, said first nonvolatile memory cell having a first charge storage element and said second nonvolatile memory cell having a second charge storage element, said first and second charge storage elements being enabled to retain the state of a data bit as a difference in charge level between said first charge storage element and said second charge storage element; bit store means for storing the state of said latched data bit in said nonvolatile memory means, including means for generating a first control signal, said first nonvolatile memory cell acting in response to said first control signal to cause a charge level representative of said first internal node voltage level to be stored in said first charge storage element, said second nonvolatile memory cell acting in response to said first control signal to cause a charge level representative of said second internal node voltage level to be stored in said second charge storage elements such that a differential charge level is caused to exist between said first and second charge storage element which constitutes said stored data bit state; and recall means for sensing said differential charge level between said first and second charge storage elements and for causing the state of said stored data bit represented by said differential charge level to be latched into said volatile memory cell, including means for generating a second control signal and gating means responsive to said second control signal for causing said differential charge level to produce said one voltage level on said first internal node and the other said voltage level on said second internal node such that said stored data bit state is latched into said volatile memory cell.

Each nonvolatile memory cell in a preferred embodiment also includes second gating means responsive to said first control signal for selectively coupling each of said internal nodes of the volatile latch to a respective one of the nonvolatile memory cells. The second gating means enables the isolation of the low voltage, volatile memory cell from the nonvolatile memory cells. In the preferred embodiment, the second gating means comprises first and second gating or switching transistors. Each gating transistor has its drain lead connected to a corresponding one of the first and second internal nodes of the RAM volatile memory latch and a gate connected to a control line such that upon application of a control voltage on the control line the internal nodes of the volatile memory cell may be directly coupled to a respective nonvolatile memory cell for differential storage of binary data.

It can be appreciated that the source-drain path of each gating transistor is conductive only when an activating potential is applied to each respective gate. Therefore, the source-drain path of each gating transistor provides a mechanism for completely separating the internal nodes of the volatile memory cell from the nonvolatile memory cells except during store and recall operations.

Thus, the present invention comprises two floating gate nonvolatile memory cells, one on each leg (internal node) of the volatile memory latch cell, for nonvolatile storage and recall of data stored in the form of a differential charge level between two charge storage elements. This provides the advantage of reducing voltage requirements over the prior art while maintaining similar or improved operating margins.

DETAILED DESCRIPTION

Figure 1:
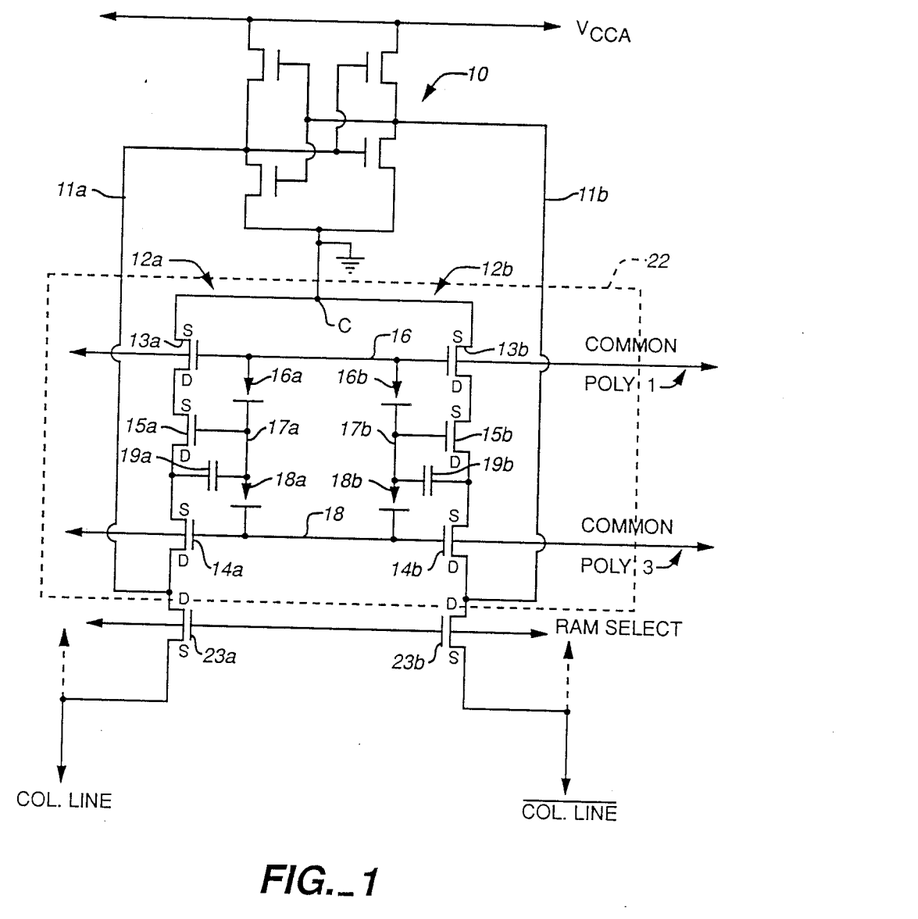
FIG. 1 is an equivalent electrical circuit diagram of a preferred embodiment of a NOVRAM according to the present invention.

Referring now to FIG. 1, a conventional volatile memory cell, e.g. an MOS latch 10, has internal nodes 11a and 11b, wherein a bit of binary data appears as one of two voltage levels on each said internal node whose value depends on whether a binary "1" or "0" is latched in said cell. That is, volatile semiconductor memory cell 10 latches a first or second state of a binary data bit wherein said first data bit state appears as a first voltage on said first internal node 11a and a second voltage level on said second internal node 11b, and wherein said second data bit state appears as said second voltage level on said first internal node 11a and as said first voltage level on said second internal node 11b.

Internal nodes 11a and 11b of MOS latch 10 are each selectively connected respectively, to complementary, nonvolatile memory elements 12a and 12b of a nonvolatile memory cell 22. Nonvolatile memory cell 22 is preferably a conventional electrically erasable programmable read only memory ($E^2PROM$). The internal nodes 11a and 11b of MOS latch 10 are each connected to a corresponding nonvolatile memory element 12a, 12b through select or gating transistors 14a and 14b, respectively. These transistors 14a and 14b provide gating means for transferring data into and out of the nonvolatile $E^2PROM$ cell 22. It will be appreciated that this enables the conventional MOS latch 10 to drive data directly into each nonvolatile element 12a, 12b without the need for high voltage buffers or level shifters. As will be explained below, the MOS latch 10 is isolated from higher voltages used in programming the $E^2PROM$ 22 because such higher voltages are only applied to the gates of transistors 14a, 14b and are thus dialectically isolated therefrom.

Each $E^2PROM$ 12a and 12b includes another gating means comprising an MOS field effect transistor (FET) 13a and 13b respectively. The source of each FET 13a and 13b is connected to ground through a common node C. The drains of the FETs 13a and 13b are each connected to a respective source of a floating gate FET 15a and 15b, respectively. The gates of FETs 13a and 13b are each connected to a control line or programming electrode designated common poly 1. FET's 13a and 13b each serve the role of the $E^2PROM$ cell ground isolation transistor so that during a nonvolatile store operation, there is no leakage path from either nodes 11a or 11b through their respective $E^2PROM$ cell to ground which would affect the state of the latched data on nodes 11a and 11b. This control line, the programming electrode also provides a means for tunneling electrons onto floating gates 17a, 17b during a nonvolatile store operation. The FET's 13a and 13b also act as recall gates to couple floating gate FET's 15a and 15b to a reference potential such as ground during a stored data bit recall operation, as described below.

Floating gate MOSFETs 15a and 15b each have a drain connected to a corresponding source of FETs 14a and 14b which are the E²PROM select or gating transistors. The gates of transistors 14a and 14b also are connected to a second control line or erase/store electrode designated common poly 3. The drains of FETs 14a and 14b are connected directly to the internal nodes 11a and 11b of the standard MOS cross coupled RAM latch 10.

Floating gate MOSFETs 15a and 15b have electrically isolated floating gates 17a and 17b. Nonvolatile storage of binary data is accomplished by tunneling electrons on or off of floating gates 17a and 17b, after which the charge levels are held indefinitely until another tunneling operation occurs. Thus, the differing levels of charge or the floating gate is indicative of a binary 1 or 0. The tunneling regions 16a,b and 18a,b for tunneling electrons to or from the floating gates 17a,b may be likened to zener diodes having zero conduction for a voltage less than a given threshold voltage and a high conduction for a voltage greater than or equal to the threshold voltage. In the preferred embodiment, transistors 13a, 13b, and 14a, 14b, are N channel devices and function as voltage activated switches. The conductivity of the channel regions of the N channel MOSFETs 15a, 15b are controlled directly by the charge held on the floating gates 17a, 17b. That is, a more negative charge on a floating gate reduces the conductivity of its associated channel region, while a more positive charge on a floating gate increases the conductivity of the channel.

Figure 2:
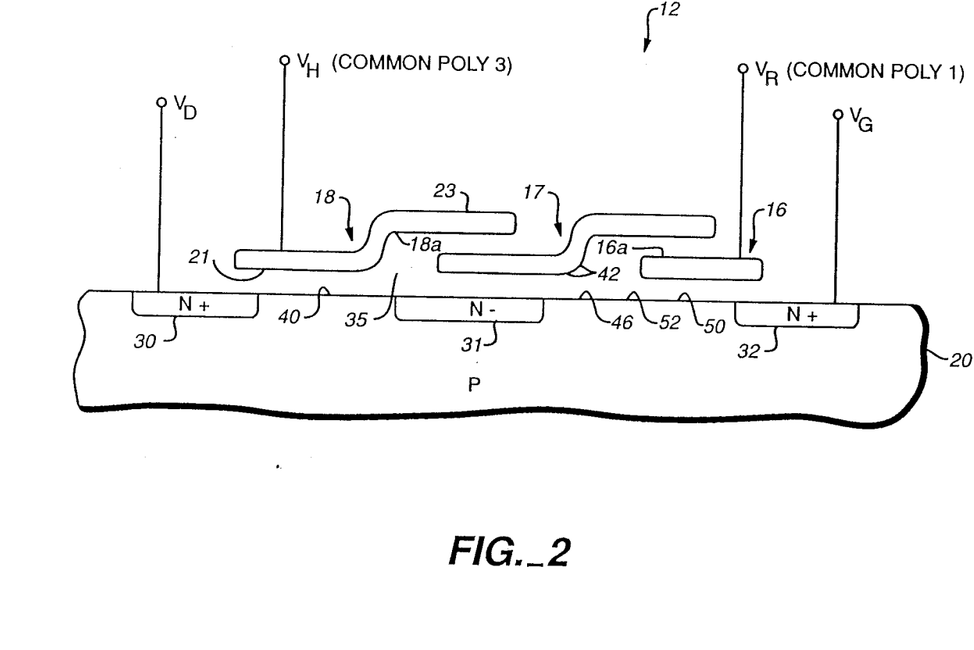
FIG. 2 is a schematic cross-sectional view of a nonvolatile $E^2PROM$ element according to the present invention.

Referring now to FIG. 2, the construction of the E²PROM cells 12a, 12b is as follows. Because the construction details are the same for each E²PROM cell 12a, 12b, corresponding references are made to E²PROM cell 12a of FIG. 1 for the sake of convenience.

Each nonvolatile memory cell 12 includes a substrate 20 of a first conductivity type, for example, P type as shown in FIG. 2. Three different substrate regions of a second conductivity type are preferably formed in substrate 20, including a first substrate region 30, a second substrate region 31 and third substrate region 32. Substrate regions 30 and 32 are preferably N+ implants, and substrate region 31 is preferably an N− implant.

A conductive layer 17 is surrounded by electrically isolating layers of oxide 35 to form an electrically isolated floating gate 17 to provide nonvolatile charge storage. Floating gate 17 corresponds to floating gate 17a of FIG. 1. Floating gate 17 has a first portion capacitively coupled, through the isolating oxide layer 35, to said second substrate region 31. Floating gate 17 has a second portion capacitively coupled (through the dielectric isolation layer 35) to a first electrically isolated conductive layer 16. The capacitive coupling between the floating gate 17 and the substrate region 31 is shown in FIG. 1 as capacitance 19a. The capacitive coupling between the second portion of the floating gate 17 and the conductive layer 16 is shown in FIG. 2 as a programming tunneling region or tunneling electrode 16a.

A second conductive layer 18 has a first portion 21 extending between said first substrate region 30 and second substrate region 31, and spaced apart from the surface of the substrate 20. Conductive layer 18 has a second portion 23 capacitively coupled (through the dielectric isolation layer 35) to floating gate 17. The capacitive coupling of second portion 23 of conductive layer 18 to the floating gate 17 is shown in FIG. 2 as an erase tunneling region or erase tunneling electrode 18a.

The first portion 21 of conductive layer 18 forms the gate of FET transistor 14a, shown in FIG. 1. Referring both to FIG. 1 and FIG. 2, and describing below just E²PROM element 12a, since element 12b is a mirror image thereof, gating transistor 14a has a channel 40 disposed between first substrate region 30 and second substrate region 31. These latter substrate regions 30, 31 form the drain and source, respectively of gating transistor 14a. A third portion 42 of floating gate layer 17 is disposed over a channel region 46 and forms the gate of an insulated gate transistor 15a of FIG. 1, also referred to herein as the floating gate transistor. Transistor 15a is an enhancement mode transistor in the present embodiment but could also be depletion mode as well. Second substrate region 31 forms the drain of transistor 15a of FIG. 1. First conductive layer 16 forms the gate of transistor 13a of FIG. 1. Transistor 13a is an enhancement mode transistor but could be a depletion mode transistor as well. Third substrate region 32 forms the source of transistor 13a of FIG. 1 which is coupled to ground. First conductive layer 16 and third substrate region 32 extend generally parallel with each other. First conductive layer 16 overlies a channel 50 of transistor 13a of FIG. 1. Transistors 15a and 13a of FIG. 1 are connected to each other by a region 52 between channel 46 of transistor 15a and channel 50 of transistor 13a, respectively. Region 52 can be best described as a virtual junction. Transistor 15a and transistor 13a are equivalent to a single enhancement (or depletion, if so used) mode transistor having two adjacent gates, wherein third portion 42 of floating gate layer 17 forms one gate and first conductive layer 16 forms a second gate adjacent the first gate.

A bias or first control potential $V_R$ is applied by way of a first control line denoted common poly 1 (FIGS. 1 and 2) to the gates of transistors 13a and 13b formed by the first polysilicon layer 16 of FIG. 2. $V_R$ is thus also applied to the poly 1 electrodes of programming tunneling devices 16a and 16b. A data potential $V_D$ is applied to substrate region 30 of FIG. 2. This corresponds to the application of potentials representative of binary data from internal nodes 11a, 11b to the drains of gating transistors 14a, 14b in FIG. 1. A second control potential $V_H$ is applied to the gates of gating transistors 14a, 14b by way of a control line denoted common poly 3 in FIGS. 1 and 2. $V_H$ is also applied to the poly 3 electrodes of the erase tunneling devices 18a and 18b. The foregoing control lines are common to all memory cells when configured as an array. These first and second control potentials, $V_R$ and $V_H$, comprise a control signal to the nonvolatile memory cell to cause the floating gate 17a or 17b to store the state of a latched data bit as a given charge level thereon.

The way in which programming and erasing of the nonvolatile element 22 in FIG. 1 is controlled by the current state of the binary data written in the MOS RAM latch will now be described. For the sake of simplicity, the operation of only one nonvolatile E²PROM element 12a need be described, as both E²PROM elements 12a, 12b are programmed and erased in exactly the same manner. Data is initially written into a standard MOS RAM latch 10 by conventional techniques. Transistors 23a and 23b are standard select transistors which comprise conventional means for selecting the MOS latch used for reading and writing data using the RAM SELECT line under the conditions shown in TABLE 1. An example of the conditions under which the data in the standard MOS latch 10 is then stored into the nonvolatile element is shown in TABLE I. For nonvolatile storage, the line designated common poly 1 is set to −3 volts. The common poly 3 line is then brought to +18 volts as shown in TABLE I. Note that the designations poly 1 and poly 3 are illustrative only and are not necessarily indicative of layers of polysilicon.

Storing of nonvolatile data into the E²PROM 22 is done as follows. As shown in FIG. 1, E²PROM 22 has two complementary E²PROM cells 12a and 12b, one of which is programmed when the other is being erased. Programming of one of the E²PROM elements occurs as follows. One E²PROM element of the nonvolatile E²PROM 22 (for example, 12a) receives a voltage level which is typically about 5 volts. In this case, the other E²PROM element 12b of the nonvolatile E²PROM 22 receives a voltage level which is about zero volts. These voltage levels are representative of one particular data bit state, and are reversed for the complementary data bit state. E²PROM 12a receives the voltage level, which is typically 5 volts, from internal node 11a at the drain of transistor 14a. This is shown in FIG. 2 as voltage $V_D$ being applied to the first substrate region 30. At the same time, a control potential $V_H$ is applied by common poly 3 to conductive layer 18 which is the gate of transistor 14a. The control potential $V_H$ is more than sufficient to invert the conductivity of the channel region 40 of transistor 14a to enable the full amplitude of data potential $V_D$ to be coupled to second substrate region 31. The data potential $V_D$ is then capacitively coupled (as shown schematically at 19a in FIG. 1) through the dielectric to the floating gate 17a. This couples floating gate 17a high with respect to conducting layer 16.

The control potential $V_H$, the common poly 1 potential $V_R$, and the data potential $V_D$ are selected such that when $V_D$ is at a high potential representing a first binary state, a sufficient potential difference is developed between the first conductive layer 16, which is held at a low potential, $V_R$, and the floating gate 17a, which is capacitively coupled high by both $V_D$ and $V_H$ going high, so that electrons tunnel from the first conductive layer 16 through the first programming tunneling region 16a, to the floating gate 17a while the potential difference across tunneling region 18a is kept low. This operation is referred to as 'programming' the floating gate, since extra electrons are tunneled onto the floating gate by this process. These extra electrons will then remain on the floating gate after the $V_D$, $V_R$ and $V_H$ control signals are removed, leaving the floating gate at a more negative voltage.

The other E²PROM element (12b in this example) of the non-volatile E²PROM 22 receives a voltage level, which is typically 0 volts, from the internal node 11b at the drain of transistor 14b. When the data voltage $V_D$ is low, the potential of the second substrate region 31 is also held low as transistor 14b turns on when $V_H$ is applied to its gate (first portion 21 of conductive layer 18). The capacitance 19b between the first portion of the floating gate 17b and second substrate region 31 as well as the capacitive effects of tunneling region 16b and channel region 46 will capacitively hold the floating gate 17b low upon application of the control voltage $V_H$ to the second conductive layer 18. Therefore, the potential difference across tunneling region 16b is small and the potential difference across tunneling region 18b is large. As a result, electrons will tunnel from floating gate 17b to second conductive layer 18. This is referred to as erasing the floating gate, since electrons are tunneled off of the floating gate by this process. This leaves the floating gate at a more positive voltage (since negative charges have been removed) after the control signals $V_D$, $V_R$ and $V_H$ are removed. Storing of complementary data to the nonvolatile E²PROM occurs by reversing the data voltages in the latch and thus reversing the above described operations of E²PROM elements 12a and 12b.

For high voltage power considerations during tunneling of electrons across either tunneling region 16a or tunneling region 18a, the bias potential of the first semiconductor layer 16 forming the gate of transistor 13a and the reference potential $V_G$ of substrate region 32 forming the source of transistor 13a are selected so that no current is developed in channel 50 from virtual junction 52 which is equivalent to the electrical connection between the drain of transistor 13a and the source of transistor 15a. Accordingly, the gate to source voltage, $V_R - V_G$ of transistor 13a is normally biased negatively in a preferred embodiment of the present invention during tunneling so that transistor 13a remains in a "cut off" condition irrespective of the drain voltage at virtual junction 52.

The recalling into latch 10 of nonvolatile data stored in the nonvolatile E²PROMS 22, in the preferred embodiment, will now be described.

Referring to TABLE I, an example of the conditions under which the nonvolatile data is recalled back into the nonvolatile RAM latch are provided. As described in greater detail below, to initiate the recall of data from the E²PROM 22, the positive supply voltage, $V_{CCA}$, is first dropped below a predetermined value such that said latched binary state can be overwritten by the nonvolatile cell. Preferably, the supply voltage merely drops to 0 volts. Then, a control signal of approximately +1.5 volts or more is applied to the common poly 1 and common poly 3 lines simultaneously. During this time, the positive supply voltage $V_{CCA}$ is ramped from 0 volts to $V_{CC}$ at a controlled ramp rate. The control signal thus creates a conductive path via said transistors 13a, 13b and 14a, 14b between each said first and second floating gate transistors 15a, 15b and a corresponding internal node 11a, 11b such that the differential charge level existing between said floating gates 17a, 17b is caused to establish a corresponding latched state of said volatile memory cell. In other words, the difference in conductivity between the first and second conductive paths formed through respective floating gate transistors 15a, 15b generates two different voltage levels on said internal nodes 11a, 11b of sufficient minimum threshold voltage magnitude so as to cause the stored data bit state in said floating gates 17a, 17b to be latched into said latch 10.

More specifically, if, for example, the floating gate 17a of transistor 15a of the E²PROM cell 12a was previously erased (indicating a voltage level of about 0 volts was on node 11a in the latch during the Store cycle), then electrons or negative charges were removed from the floating gate 17a leaving a more positive charge level on the floating gate. In this case, complementary floating gate 17b of the nonvolatile section 22 would be programmed to have a more negative charge indicative of a voltage level of about $V_{CC}$ or 5 volts on node 11b of latch 10. As $V_{CCA}$ is ramped from 0 volts to $V_{CC}$, supplying power to the RAM 10, the common poly 1 and common poly 3 lines simultaneously have a control signal of approximately 1.5 volts or more coupled thereto. This voltage is applied to the gates of transistors 13a, 14a, 13b, and 14b, thereby making channels 40 and 50, respectively, of those transistors conductive. Because the floating gate 17a is at a more positive charge level than the complementary floating gate 17b, the channel of transistor 15a is more conductive than the channel of transistor 15b. Thus, the path from node 11a of the RAM latch 10 through the E²PROM cell 12a to ground or some other reference potential is more conductive than the complementary path from node 11b of the RAM latch through the E²PROM cell 12b to ground or some other reference potential. As $V_{CCA}$ is ramped from 0 volts to $V_{CC}$ the balanced cross-coupled RAM latch 10 works as a very sensitive amplifier of the differential voltage that develops due to the differences in conductance between the two floating gate channels. Even a small difference in conductance can be detected and then latched into the RAM under these conditions. In this case, the more conductive channel of transistor 15a holds node 11a closer to ground than node 11b as $V_{CCA}$ is ramped, resulting in a sensing and latching of a low level on node 11a and a high level on node 11b. Thus, the original data state retained in the nonvolatile section 22 is recalled and latched correctly into the RAM latch 10.

It should be noted that by using two E²PROM cells with a differential sensing technique for recall, only a small difference in floating gate charge level is needed to successfully recall nonvolatile data into RAM. Since a small charge level difference can be sensed, there is no need to completely turn off one cell and turn on by several volts the complementary cell in order to recall data. This invention thus minimizes the amount of charge that must be tunneled to or from the floating gates in order to store and recall data successfully, which reduces the high voltage levels needed to store a data bit in the nonvolatile memory 22 and consequently greatly improves the endurance of the NOVRAM according to the present invention.

In the present invention, the RAM 10 is completely isolated and protected from the high voltages applied to the common poly 3 line. This is in contrast to certain prior art devices wherein the high voltage is coupled directly into the RAM. The gating transistors 14a, 14b isolate the internal nodes 11a, 11b of the RAM latch from the nonvolatile E²PROM thereby completely isolating and separating the RAM read and write operations from the nonvolatile E²PROM. This isolation provides two important advantages. First, the RAM latch can be designed as a balanced, cross-coupled latch without any instabilities due to unmatched conductances between branches introduced by nonvolatile elements. Such imbalances in RAM latches often cause instabilities in the latch which can lead to voltage or pattern sensitivities which reduce yield, increase testing costs, and reduce reliability of the NOVRAM. The second advantage is that during the operation of the standard MOS RAM cell, the nonvolatile floating gate 17a is fully isolated by maintaining the common poly 3 and common poly 1 lines at ground potential. This thereby eliminates any possibility of losing nonvolatile data due to gradual tunneling that might occur if $V_{CC}$ is applied to the nonvolatile E²PROM over a long period of time.

The simplest approach to implementing the present invention is to program the nonvolatile data states using a positive supply voltage of 5 volts plus or minus 10%. This enables the use of an existing, scaled, low voltage, high performance CMOS process for the RAM cells. This also avoids the necessity for additional circuitry in order to pump $V_{CCA}$ above the level of $V_{CC}$. If higher tunneling voltages are desirable, $V_{CCA}$ could be pumped up to a somewhat higher voltage, e.g., 8-10 volts, that is only limited by transistor, junction, or oxide reliability considerations.

According to the present invention, a relatively small data or 'steering' voltage differential is all that is required to control or direct tunneling of charge to or from isolated gates 17a and 17b. In contrast to prior art methods, including capacitive coupling, the present invention uses a small voltage differential for sensing and recalling instead of a large floating gate voltage change to turn off a single E²PROM cell. This prolongs the useful lifetime of the device because it minimizes the amount of charge which must be tunneled to or from the floating gates 17a and 17b. Data storage can be accomplished by tunneling only just enough charge to provide a differential charge level between two E²PROM cells that can be recalled successfully. Device lifetime is prolonged because lower voltages can be used to tunnel the small amount of charge needed, which greatly reduces the trap up rate of tunneling electrons.

A number of cell design, process and layout parameters are available for adjusting appropriate floating gate voltage levels for the respective memory states in order to insure proper recall. The layout of the cell can be varied to adjust the tunneling and floating gate isolation areas. Additionally, the operating voltages during the store and recall cycles can also be varied to give desired floating gate voltage levels. For example, a higher word line voltage level during the write cycle brings the floating gate levels more positive thereby favoring the erased state. More negative common poly 1 voltages have the reverse effect, making the programmed state more favorable. Preferably, the common poly i line is in the range of 0 to −3 volts and common poly 3 line is +18 volts during store operations. Both lines are maintained at a minimum of 1.5 volts during recall.

According to the present invention, higher device endurance may be achieved by raising $V_{CCA}$ to 8 volts during the store operation. $V_{CCA}$ may be pumped from 5 volts to the 8 volt level with an on-chip charge pump just prior to raising the common poly 3 line.

An electrically erasable programmable read only memory (E²PROM) cell size according to the present invention is approximately 750 microns², using 1.5 micron technology, with a supply voltage $V_{CCA}$ of 8 volts, and control lines common poly 1 and common poly 3 at −3 volts and +18 volts, respectively.

The foregoing features according to the present invention may be used to implement alternative embodiments utilizing NOVRAM operation and architecture.

While the invention has been described in connection with what is presently considered the most practical and preferred embodiments, it is to be understood that the invention is not limited to the disclosed embodiments but, on the contrary is intended to cover various modifications and equivalent arrangements included within the scope of the appended claims.

TABLE I

| MODE | COL/COL | RAM SELECT | $V_{CCA}$ | COMMON POLY 1 | COMMON POLY 3 | INTERNAL NODES Data | Data |
| --- | --- | --- | --- | --- | --- | --- | --- |
| Standby |  | 0 | 5 V | 0 | 0 | 5(0) | 0(5) |
| Read | Data $\overline{\text{Data}}$ | 5 V | 5 V | 0 | 0 |  |  |
| Write | Data In $\overline{\text{Data In}}$ | 5 V | 5 V | 0 | 0 |  |  |
| Store | | 0 | 5 V | −3 v | 18 v | 5(0) | 0(5) |
| Recall | | 0 | Ramp 0 v–5 v | Pulse to about 1.5 volts or more during the ramp time | Pulse to about 1.5 volts or more during the ramp time | | |

What is claimed is:

1. A nonvolatile memory device for nonvolatile storage of binary data comprising:
   a volatile semiconductor memory cell for latching a bit of binary data, said cell including first and second internal nodes wherein said bit of binary data appears as one of two voltage levels on each said internal node whose value depends on whether a binary "1" or "0" is latched in said cell;
   a nonvolatile memory means comprising first and second nonvolatile memory cells, said first nonvolatile memory cell having a first charge storage element and said second nonvolatile memory cell having a second charge storage element, said first and second charge storage elements being enabled to retain the state of a data bit as a difference in charge level between said first charge storage element and said second charge storage element;
   bit store means for storing the state of said latched data bit in said nonvolatile memory means, including means for generating a first control signal, said first nonvolatile memory cell acting in response to said first control signal to cause a charge level representative of said first internal node voltage level to be stored in said first charge storage element, said second nonvolatile memory cell acting in response to said first control signal to cause a charge level representative of said second internal node voltage level to be stored in said second charge storage element such that a differential charge level is caused to exist between said first and second charge storage element which constitutes said stored bit state; and
   recall means for sensing said differential charge level between said first and second charge storage elements and for causing the state of said stored data bit represented by said differential charge level to be latched into said volatile memory cell, including means for generating a second control signal and gating means responsive to said second control signal for causing said differential charge level to generate a first conductive path to a reference potential such that said one voltage level is produced on said first internal node and to generate a second conductive path to a reference potential such that the other said voltage level is produced on said second internal node, said stored data bit state being latched into said volatile memory cell thereby.

2. A nonvolatile memory device as in claim 1 further comprising second gating means responsive to said first control signal for selectively coupling each of said internal nodes to a respective one of said nonvolatile memory cells.

3. A nonvolatile memory device for nonvolatile storage of binary data comprising:
   a volatile semiconductor memory cell for latching a bit of binary data, said cell including first and second internal nodes wherein said bit of binary data appears as one of two voltage levels on each said internal node whose value depends on whether a binary "1" or "0" is latched in said cell;
   a nonvolatile memory means comprising first and second nonvolatile memory cells, said first nonvolatile memory cell having a first electrically insulated floating gate and said second nonvolatile memory cell having a second electrically insulated floating gate, said first and second floating gates being enabled to retain the state of a data bit as a difference in charge level between said first floating gate and said second floating gate;
   bit store means for storing the state of said latched data bit in said nonvolatile memory means, including means for generating a first control signal, said first nonvolatile memory cell acting in response to said first control signal to cause a charge level representative of said first internal node voltage level to be stored in said first floating gate, said second nonvolatile memory cell acting in response to said first control signal to cause a charge level representative of said second internal node voltage level to be stored in said second floating gate such that a differential charge level is caused to exist between said first and second floating gate which constitutes said stored data bit state; and
   recall means for sensing said differential charge level between said first and second floating gate and for causing the state of said stored data bit represented by said differential charge level to be latched into said volatile memory cell, including means for generating a second control signal and gating means responsive to said second control signal for causing said differential charge level to produce said one voltage level on said first internal node and the other said voltage level on said second internal node such that said stored data bit state is latched into said volatile memory cell.

4. A nonvolatile memory device as in claim 3 wherein said first nonvolatile memory cell includes means responsive to said first control signal for transferring charge to said first floating gate when said first internal node is at a first voltage level and for transferring charge from said first floating gate when said first internal node is at a second voltage level, and wherein said second nonvolatile memory cell includes means responsive to said first control signal for removing charge to said second floating gate when said second internal node is at a first voltage level and for removing charge from said second floating gate when said second internal node has a second voltage level, such that for a given data bit state a differential charge level is created between said first and second floating gates.

5. A nonvolatile memory device as in claim 3 wherein each nonvolatile memory cell includes:
   a programming electrode;
   an erase/store electrode; and
   means for capacitively coupling the voltage level of the internal node coupled to said nonvolatile memory cell to the floating gate of said cell;
   and wherein said means for generating a first control signal includes:
   means for biasing said programming electrode at a first control potential; and
   means for biasing said erase/store electrode at a second control potential such that charge is caused to tunnel between said programming electrode and said floating gate if said internal node is at a first voltage level and such that charge is caused to tunnel from said floating gate to said erase/store electrode if said internal node is at a second voltage level.

6. A nonvolatile memory device as in claim 5 further comprising second gating means responsive to said first control signal for selectively coupling each of said internal nodes to a respective one of said nonvolatile memory cells, wherein said second gating means including first and second transistor switches whose states are controlled by said first control signal, said first transistor switch coupling said first internal node to said first nonvolatile memory cell in response to said first control signal, and said second transistor switch coupling said second internal node to said second nonvolatile memory cell in response to said first control signal.

7. A nonvolatile memory device as in claim 6 wherein said first control signal is a voltage in the range from approximately −5 volts to ground potential, wherein said second control signal is a voltage in the range of approximately +15 to +25 volts, and wherein said internal node first voltage level is in the range of approximately +3 to +5 volts and said internal node second voltage level is approximately ground potential.

8. A nonvolatile memory device as in claim 7 wherein said means for generating a first control signal further includes means for biasing said programming electrode and said erase/store electrode at ground potential when said bit store means is not storing the state of said latched data bit in said nonvolatile memory means.

9. A nonvolatile memory device as in claim 1 further comprising a voltage source for supplying a voltage to said volatile memory cell of sufficient magnitude so as to enable said volatile memory cell to retain its current latched state; and wherein said recall means includes means for causing said voltage source to drop below a predetermined value and for causing said voltage source to ramp back up to said sufficient magnitude such that said differential charge level is caused to establish a corresponding latched state of said volatile memory cell.

10. A nonvolatile memory device as in claim 9 wherein said first nonvolatile memory cell includes a first floating gate transistor whose conductivity is controlled by the charge level of said first floating gate and wherein said second nonvolatile memory cell includes a second floating gate transistor whose conductivity is controlled by the charge level of said second floating gate, and wherein said gating means comprises a first recall gate responsive to said second control signal for selectively coupling said first floating gate transistor to a reference voltage and a second recall gate responsive to said second control signal for selectively coupling said second floating gate transistor to said reference voltage, such that a path of a first conductivity is generated between said first internal node and said reference voltage as a function of said first floating gate charge level and such that a path of a second conductivity is generated between said second internal node and said reference voltage as a function of said second floating gate charge level.

11. A nonvolatile memory device as in claim 10 wherein each said recall gate comprises a transistor switch responsive to said second control signal, and wherein said reference voltage is ground potential.

12. A nonvolatile memory device as in claim 10 wherein said volatile memory cell includes a cross-coupled transistor latch and wherein a differential voltage level between said internal nodes is caused by the difference in conductivity between said first and second conductivity paths which is representative of the state of said stored data bit, said differential voltage level being at a level that is at least the minimum threshold voltage needed to cause said stored data bit state to be latched into said latch.

13. A nonvolatile memory device for nonvolatile storage of binary data comprising:
   a volatile semiconductor memory cell for latching a first or second state of a binary data bit, said cell including first and second internal nodes wherein said first data bit state appears as a first voltage level on said first internal node and a second voltage level on said second internal node, and wherein said second data bit state appears as said second voltage level on said first internal node and as said first voltage level on said second internal node;
   a nonvolatile memory comprising first and second nonvolatile memory cells, said first nonvolatile cell having a first charge storage element and said second nonvolatile cell having a second charge storage element, said charge storage elements capable of retaining a nonvolatile data bit as a difference in charge level between said first charge storage element and said second charge storage element;
   means for generating a first control signal;
   gating means responsive to said first control signal such that said nonvolatile memory cells are coupled to a reference potential when said first control signal is in a first state and said nonvolatile memory cells are isolated from said reference potential when said first control signal is in a second state;
   store means for transferring and storing the state of the data bit held in said volatile memory cell to said nonvolatile memory including means for causing said first control signal generating means to generate said second state of said first control signal, means for charging said first charge storage element to a first charge level representative of said first internal node voltage level, and means for charging said second charge storage element to a second charge storage level representative of said second internal node voltage level such that a differential charge level is caused to exist between said first and second charge storage elements; and recall means for sensing said differential charge level on said first and second charge storage elements corresponding to said stored data bit state and for causing said stored data bit state to be latched into said volatile memory cell, including means for causing said first control signal generating means to generate said first state of said first control signal.

14. A nonvolatile memory device as in claim 13 further comprising means for generating a second control signal and second gating means responsive to said second control signal for selectively coupling each of said internal nodes to a respective one of said nonvolatile memory cells.

15. A nonvolatile memory device as in claim 13 wherein said first and second charge storage elements comprise first and second floating gates respectively, and wherein each said nonvolatile memory cell includes:
a programming electrode;
an erase/store electrode; and
means for capacitively coupling the voltage level of the internal node coupled to said nonvolatile memory cell to the floating gate of said cell;
and wherein said means for generating a first control signal includes:
means for biasing said programming electrode at a first control potential; and
means for biasing said erase/store electrode at a second control potential such that charge is caused to tunnel between said programming electrode and said floating gate if said internal node is at a first voltage level and such that charge is caused to tunnel from said floating gate to said erase/store electrode if said internal node is at a second voltage level.

16. A nonvolatile memory device as in claim 15 further comprising second gating means responsive to said first control signal for selectively coupling each of said internal nodes to a respective one of said nonvolatile memory cells, wherein said second gating means including first and second transistor switches whose states are controlled by said first control signal, said first transistor switch coupling said first internal node to said first nonvolatile memory cell in response to said first control signal, and said second transistor switch coupling said second internal node to said second nonvolatile memory cell in response to said first control signal.

17. A nonvolatile memory device as in claim 16 wherein said first control potential is a voltage in the range from approximately −5 volts to ground potential, wherein said second control potential is a voltage in the range of approximately +15 to +25 volts, and wherein said internal node first voltage level is in the range of approximately +3 to +5 volts and said internal node second voltage level is approximately ground potential.

18. A nonvolatile memory device as in claim 17 wherein said means for generating a first control signal further includes means for biasing said programming electrode and said erase/store electrode at ground potential when said bit store means is not storing the state of said latched data bit in said nonvolatile memory means.

19. A nonvolatile memory device as in claim 13 further comprising a voltage source for supplying a voltage to said volatile memory cell of sufficient magnitude so as to enable said volatile memory cell to retain its current latched state; and wherein said recall means includes means for causing said voltage source to drop below a predetermined value and for causing said voltage supply to ramp back up to said sufficient magnitude such that said differential charge level is caused to establish a corresponding latched state of said volatile memory cell.

20. A nonvolatile memory device as in claim 19 wherein said first nonvolatile memory cell includes a first floating gate and a first floating gate transistor whose conductivity is controlled by the charge level of said first floating gate and wherein said second nonvolatile memory cell includes a second floating gate and a second floating gate transistor whose conductivity is controlled by the charge level of said second floating gate, and wherein said gating means comprises a first recall gate responsive to said first control signal for selectively coupling said first floating gate transistor to said reference potential and a second recall gate responsive to said first control signal for selectively coupling said second floating gate transistor to said reference potential, such that a path of a first conductivity is generated between said first internal node and said reference potential as a function of said first floating gate charge level and such that a path of a second conductivity is generated between said second internal node and said reference potential as a function of said second floating gate charge level.

21. A nonvolatile memory device as in claim 20 wherein each said recall gate comprises a transistor switch responsive to said first control signal, and wherein said reference potential is ground potential.

22. A nonvolatile memory device as in claim 20 wherein said volatile memory cell includes a cross-coupled transistor latch and wherein a differential voltage level between said internal nodes is caused by the difference in conductivity between said first and second conductivity paths which is representative of the state of said stored data bit, said differential voltage level being at a level that is at least the minimum threshold voltage needed to cause said stored data bit state to be latched into said latch.

23. A nonvolatile memory device comprising:
a volatile semiconductor memory cell for storing binary data as complementary voltage levels on first and second internal nodes;
means for reading from and writing to said volatile memory cell;
a nonvolatile memory means comprising first and second nonvolatile memory cells including first and second electrically insulated floating gate conductors for storing said binary data as a differential charge level between said floating gate conductors;
means for capacitively coupling said volatile memory cell to said nonvolatile memory means and for copying the memory state of said volatile memory cell to said floating gate conductors such that a first charge level is created on said first floating gate conductor and a second charge level is created on said second floating gate conductor, said means for copying comprising first and second electrodes in each said nonvolatile memory cell positioned capacitively adjacent corresponding first and second floating gates, such that the application of a store control signal to said electrodes causes the present memory state of said volatile memory cell to be transferred into said nonvolatile memory means as said first and second charge levels on said first and second floating gate conductors; and means for causing the memory state of said nonvolatile memory means to be copied to said volatile memory cell.

24. A nonvolatile memory cell for nonvolatile storage of binary data comprising:

a volatile memory cell having first and second internal nodes for storing a bit of binary data as complementary voltage levels on said internal nodes, said complementary voltage levels depending on whether said binary data bit is a "1" or "0";

a source for supplying voltage to said volatile memory cell;

a nonvolatile memory comprising first and second electrically erasable programmable read only memory cells connected to corresponding first and second internal nodes, said first electrically erasable programmable read only memory cell having a first floating gate transistor with a drain, a source and an electrically isolated floating gate, said second electrically erasable and programmable read only memory having a second floating gate transistor with a drain, a source and a second electrically isolated floating gate, said first and second floating gates for storing binary data as a differential charge level between said first and second floating gates;

said first and second electrically erasable read only memory means further comprising:

first and second ground isolation switch means for selectively coupling said floating gate transistors to ground, said first isolation switch means having a source connected to ground, a gate, and a drain connected to said source of said first floating gate transistor, said second isolation switch means having a source connected to ground, a drain connected to said source of said floating gate transistor and a gate;

a first control line for receiving applied potential levels connected to said gates of said first and said second isolation switch means and having a first electrode disposed in a capacitive relation with said first floating gate for tunneling electrons onto said first floating gate of said first floating gate transistor, and having a second electrode disposed in a capacitive relation with said second floating gate for tunneling electrons onto said second floating gate of said second floating transistor, such that for a first potential level on said first control line, said electrically erasable programmable read only memory cells are coupled to ground potential, and for a second potential level on said first control line, said electrically erasable programmable read only memory cells are isolated from ground potential;

a first gating switch means for selectively coupling said first internal node to said first floating gate transistor, said first gating switch means having a source connected to said drain of said floating gate transistor, a drain connected to said first internal node, and a gate;

a second gating switch means for selectively coupling said second internal node to said second floating gate transistor having a source connected to said drain of said second floating gate transistor, a drain connected to said second internal node, and a gate;

a second control line for receiving applied potential levels connected to said gates of said of first and second gating switch means, said second control line having a first electrode disposed in capacitive relation with said first floating gate for removing electrons from said floating gate and having a second electrode disposed in a capacitive relation with said second floating gate for removing electrons from said second floating gate;

means for providing said second potential level on said first control line and a third potential on said second control line for causing the charging of said first floating gate to a first charge level representative of said first internal node voltage, and for causing the charging said second floating gate to a second charge storage level representative of said second internal node voltage such that a differential charge level exists between said first and second floating gates;

recall means for providing said first potential level on said first control line and for providing a fourth potential level on said second control line such that the conductive path from said first internal node to ground is responsive to the charge level on said first floating gate and the conductive path from said second internal node to ground is responsive to the charge level on said second floating gate, said first and second charge levels on said first and second floating gates corresponding to said stored data bit such that when said voltage source to said volatile memory cell is lowered and then ramped up to an operating voltage, said volatile memory cell senses the difference in said first and second conductive paths and causes said stored data bit to be latched into said volatile memory cell when a minimum threshold voltage is reached.

25. A nonvolatile memory cell as in claim 24 further comprising:

a first RAM select transistor having a drain connected to said first internal node and to said drain of said first gating switch means and having a gate and a source;

a second RAM select transistor having a drain connected with said second internal node and to said drain of said second gating transistor and having a gate connected to said gate of said first RAM select transistor and having a source;

a row address line connected to said gates of said RAM select transistors; and a first column line connected to said source of said first RAM select transistor and a second column line connected to said source of said second RAM select transistor, said row addressline and said column lines providing a means for selecting a specific RAM cell in an array of RAM cells.

26. A method for nonvolatile storage of binary data in a standard volatile random access memory latch having first and second internal nodes wherein said latched volatile data state is in the form of complementary voltage levels thereon, and wherein each internal node is selectively coupled by gating means actuated by a control signal to a corresponding nonvolatile memory, said nonvolatile memory including first and second floating gates for storing binary data as a charge level thereon, each floating gate including a corresponding floating gate transistor whose gate is said floating gate, comprising the steps of:

applying a control signal to said gating means for gating said complementary voltage levels on said first and second internal nodes to said corresponding first and second floating gate transistors;

causing a first charge level to be created on said first floating gate and a second charge level to be created on said second floating gate so as to create a differential charge level between said first and second floating gates, said differential charge level corresponding to said latched data state of said volatile memory cell; and selectively causing said volatile memory cell to sense said differential charge level between said first and second floating gates and to latch into a data state corresponding to said differential charge level between said floating gates.

27. A method for nonvolatile storage of binary data as in claim 26 wherein said step of selectively causing said volatile memory cell to sense said differential charge level between said first and second floating gates and to latch into a data state corresponding thereto further comprises the steps of:

causing a supply potential to said volatile memory cell to drop below a predetermined value such that said latched binary data state is indeterminant;

applying a second control signal to said gating means for creating a respective conductive path between each said first and second floating gate transistors and a said corresponding internal node such that a first voltage level is coupled to said first internal node and a second voltage level is coupled to said second internal node; and ramping up said supply potential to a predetermined supply voltage.

* * * * *